(12) United States Patent
Chanda et al.

(10) Patent No.: US 8,378,447 B2
(45) Date of Patent: Feb. 19, 2013

(54) ELECTRICALLY PROGRAMMABLE FUSE AND FABRICATION METHOD

(75) Inventors: Kaushik Chanda, Fishkill, NY (US); Ronald G. Filippi, Wappingers Falls, NY (US); Joseph M. Lukaitis, Pleasant Valley, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/085,632

(22) Filed: Apr. 13, 2011

(65) Prior Publication Data

US 2011/0186963 A1    Aug. 4, 2011

Related U.S. Application Data

(62) Division of application No. 12/192,387, filed on Aug. 15, 2008, now Pat. No. 8,003,474.

(51) Int. Cl.
*H01L 23/52* (2006.01)

(52) U.S. Cl. ........ 257/529; 257/528; 257/530; 257/735; 257/755; 257/E21.592; 257/E23.149

(58) Field of Classification Search .......... 257/528–530, 257/737, 755; 438/132, 215, 333
See application file for complete search history.

(56) References Cited

U.S. PATENT DOCUMENTS

| | | | |
|---|---|---|---|
| 3,413,522 A | 11/1968 | Beszedics et al. | |
| 4,413,563 A | 11/1983 | Beuchat | |
| 4,495,851 A | 1/1985 | Koerner et al. | |
| 4,525,664 A | 6/1985 | Trammell, Jr. | |
| 4,562,454 A | 12/1985 | Schultz et al. | |
| 4,752,852 A | 6/1988 | Ahl et al. | |
| 5,089,925 A | 2/1992 | Lester | |
| 5,339,741 A | 8/1994 | Craven et al. | |
| 5,430,401 A | 7/1995 | Shtulman | |
| 5,708,291 A * | 1/1998 | Bohr et al. | 257/529 |
| 5,764,463 A | 6/1998 | Arvidson et al. | |
| 5,783,985 A | 7/1998 | Kowalik et al. | |
| 5,835,324 A | 11/1998 | Hatton | |
| 6,141,202 A | 10/2000 | Maeckel et al. | |
| D437,426 S | 2/2001 | Ginsburg | |
| 6,219,215 B1 | 4/2001 | Bertin et al. | |
| 6,303,857 B1 | 10/2001 | Ginsburg | |
| 6,368,902 B1 | 4/2002 | Kothandaraman et al. | |
| 6,633,055 B2 | 10/2003 | Bertin et al. | |
| 6,641,050 B2 | 11/2003 | Kelley et al. | |
| 6,671,144 B1 | 12/2003 | Langford et al. | |
| 6,707,191 B1 | 3/2004 | Bye | |
| 6,759,820 B2 | 7/2004 | Karwath | |
| 6,872,883 B2 | 3/2005 | Ginsburg | |
| 6,924,571 B2 | 8/2005 | Bye | |
| 6,933,591 B1 | 8/2005 | Sidhu et al. | |
| 6,979,601 B2 | 12/2005 | Marr et al. | |
| 7,064,946 B2 | 6/2006 | Thiery et al. | |
| 7,076,663 B2 | 7/2006 | Kelley et al. | |
| 7,082,065 B2 | 7/2006 | Hathaway et al. | |
| 7,085,971 B2 | 8/2006 | Barth, Jr. et al. | |

(Continued)

*Primary Examiner* — A. Sefer
(74) *Attorney, Agent, or Firm* — Cantor Colburn LLP; Yuanmin Cai

(57) ABSTRACT

An electrically programmable fuse includes an anode, a cathode, and a fuse link conductively connecting the cathode with the anode, which is programmable by applying a programming current. The anode and the fuse link each include a polysilicon layer and a silicide layer formed on the polysilicon layer, and the cathode includes the polysilicon layer and a partial silicide layer formed on a predetermined portion of the polysilicon layer of the cathode located adjacent to a cathode junction where the cathode and the fuse link meet.

10 Claims, 12 Drawing Sheets

U.S. PATENT DOCUMENTS

| | | | |
|---|---|---|---|
| 7,098,721 B2 | 8/2006 | Ouellette et al. | |
| 7,106,164 B2 | 9/2006 | Voldman | |
| 7,129,769 B2 | 10/2006 | Dixon et al. | |
| 7,145,370 B2 | 12/2006 | Bernard et al. | |
| 7,170,299 B1 | 1/2007 | Anand et al. | |
| 7,177,182 B2 | 2/2007 | Diorio et al. | |
| 7,187,602 B2 | 3/2007 | Wohlfahrt et al. | |
| 7,233,463 B2 | 6/2007 | Langford et al. | |
| 7,242,614 B2 | 7/2007 | Diorio et al. | |
| 7,332,791 B2 | 2/2008 | Wu | |
| 2002/0011645 A1 | 1/2002 | Bertin et al. | |
| 2003/0205777 A1* | 11/2003 | Ito et al. | 257/529 |
| 2005/0052201 A1 | 3/2005 | Bernard et al. | |
| 2005/0087836 A1 | 4/2005 | Wu | |
| 2005/0121741 A1 | 6/2005 | Voldman | |
| 2005/0122204 A1 | 6/2005 | Voldman | |
| 2005/0127475 A1 | 6/2005 | Voldman | |
| 2005/0135037 A1 | 6/2005 | Thiery et al. | |
| 2005/0219931 A1 | 10/2005 | Diorio et al. | |
| 2005/0219932 A1 | 10/2005 | Diorio et al. | |
| 2005/0237840 A1 | 10/2005 | Diorio et al. | |
| 2006/0044049 A1 | 3/2006 | Ouellette et al. | |
| 2006/0087001 A1* | 4/2006 | Kothandaraman et al. | 257/529 |
| 2006/0091904 A1 | 5/2006 | Hathaway et al. | |
| 2006/0133140 A1 | 6/2006 | Gutnik et al. | |
| 2006/0133175 A1 | 6/2006 | Gutnik et al. | |
| 2006/0158239 A1 | 7/2006 | Bhushan et al. | |
| 2007/0090486 A1* | 4/2007 | Otsuka et al. | 257/529 |
| 2007/0210411 A1 | 9/2007 | Hovis et al. | |
| 2007/0210413 A1 | 9/2007 | Booth et al. | |
| 2007/0222028 A1 | 9/2007 | Matsuoka et al. | |
| 2007/0262413 A1* | 11/2007 | Booth et al. | 257/529 |
| 2008/0093703 A1 | 4/2008 | Yang et al. | |
| 2008/0150076 A1 | 6/2008 | Nam et al. | |
| 2009/0302417 A1* | 12/2009 | Kim et al. | 257/529 |

* cited by examiner

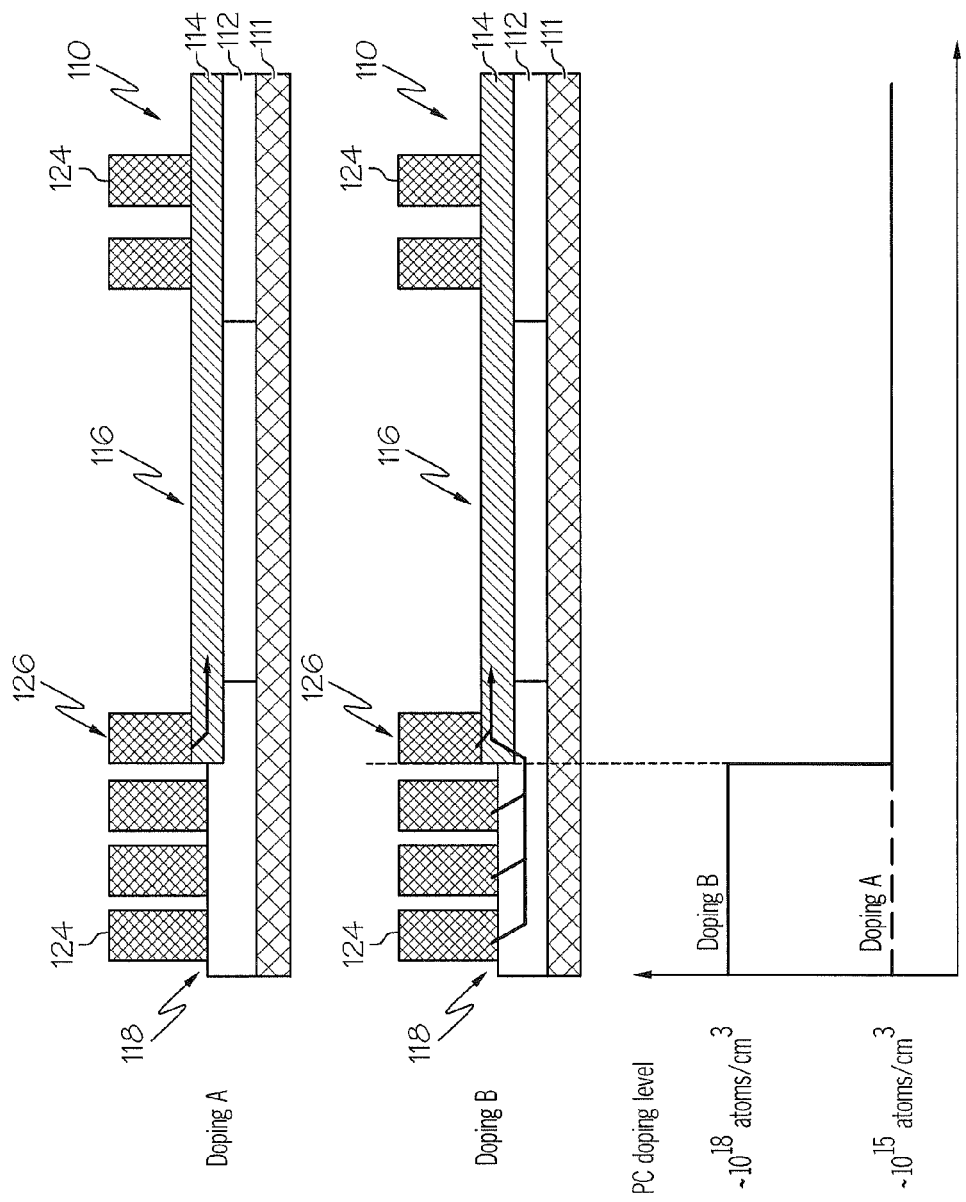

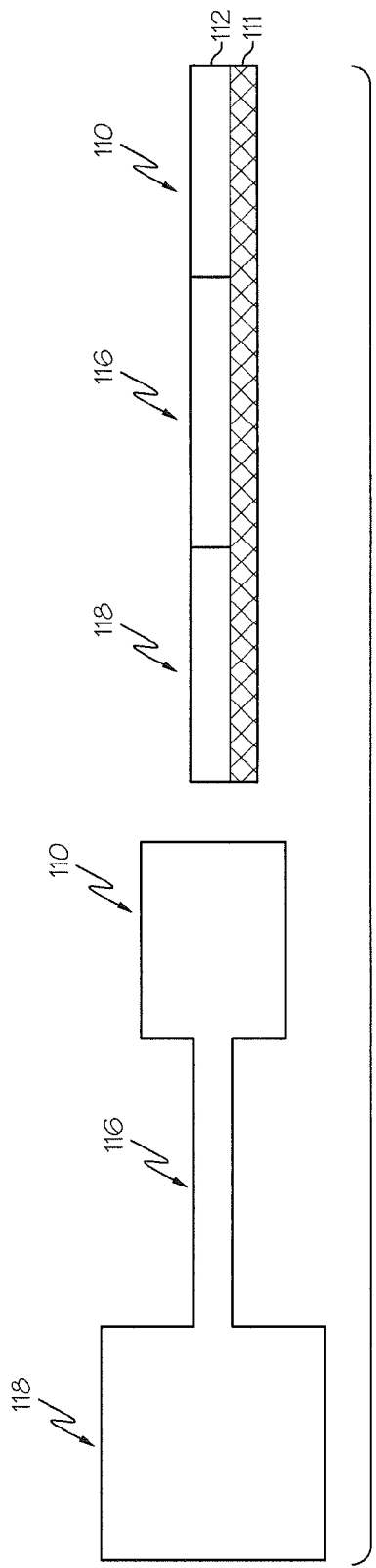
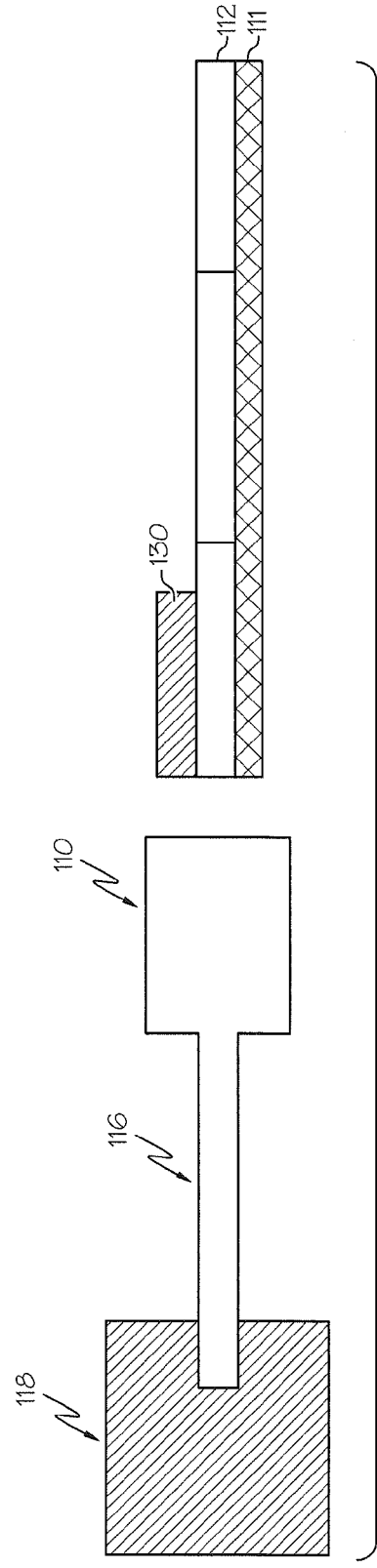
FIG. 7A
FIG. 7B

ELECTRICALLY PROGRAMMABLE FUSE AND FABRICATION METHOD

CROSS-REFERENCE TO RELATED APPLICATION

This application is a divisional of U.S. patent application Ser. No. 12/192,387, filed Aug. 15, 2008, now U.S. Pat. No. 8,003,474, the disclosure of which is incorporated by reference herein in its entirety.

BACKGROUND

This invention relates to electrically programmable fuses, and particularly to an electrically programmable fuse having an interrupted silicide layer and a fabrication method, which creates controlled electromigration flux divergence during a programming operation of the fuse.

Electrically programmable fuses have been employed in many advanced technologies within the semiconductor industry. These fuses are utilized for various integrated circuit applications such as an implementation of array redundancy, field programmable arrays, and chip-ID trimming circuits. These fuses may be programmed to store data on an integrated circuit, to adjust components on the circuit or to program logic on the circuit, for example. During programming of a conventional electrically programmable fuse, electromigration of silicide results in a local depletion or void of silicide on top of a polysilicon layer at a flux divergence region (i.e., near a junction region where out-flowing flux is greater than in-flowing flux) and in a high resistance. Flux divergence may be induced in various ways such as microstructure (e.g., grain-boundary) variation, configurational variation, or by temperature gradient. FIGS. 1A through 1C illustrate a conventional electrically programmable fuse before, during and after programming of the fuse, respectively. FIG. 1A shows an electrically programmable fuse 10 which includes an anode 16, a cathode 18 and a fuse link 20. The anode 16, the cathode 18 and the fuse link 20 include a polysilicon layer 12 (as shown in FIG. 1C, for example) which is a high resistance material and a silicide layer 14 which is a low resistance material formed on the polysilicon layer 12. A plurality of contacts 22 are formed on the anode 16 and cathode 18, respectively. The conventional electrically programmable fuse 10 is designed such that a width difference between the fuse link 20 and the cathode 18 results in current density variation. As shown in FIG. 1B, during programming, higher temperature (as indicated by the large arrow) results in temperature gradient, and a large reservoir of silicide occurs on the cathode 18 (as indicated by the small arrows). As a result, as shown in FIG. 1C, several problems occur when programming the conventional electrically programmable fuse 10. For example, massive damage in the silicide layer 14 occurs at a cathode junction where the cathode 18 and the fuse link 20 meet, thereby creating an extended silicide depletion region 24 extending into the cathode 18. Further, the fuse link 20 requires high energy (e.g., high current) to program which may have a thermal or mechanical impact, or cause damage to the contacts 22, for example.

SUMMARY

An embodiment of an electrically programmable fuse includes an anode, a cathode, and a fuse link conductively connecting the cathode with the anode, which is programmable by applying a programming current. The anode and the fuse link each include a polysilicon layer and a silicide layer formed on the polysilicon layer, and the cathode includes the polysilicon layer and a partial silicide layer formed on a predetermined portion of the polysilicon layer of the cathode located adjacent to a cathode junction where the cathode and the fuse link meet.

According to another exemplary embodiment, the present invention provides a fabrication method of an electrically programmable fuse comprising an anode, a cathode and a fuse link. The method includes forming a polysilicon layer on a substrate, forming a silicide mask on a portion of the polysilicon layer formed for the cathode to block a formation of silicide on the portion, depositing a metal layer on the silicide mask and on the polysilicon layer not covered by the silicide mask, reacting the metal layer with the polysilicon layer not covered by the silicide mask and forming a silicide layer on the polysilicon layer, and removing the silicide mask for the cathode and un-reacted deposited metal formed on the silicide mask, and exposing the polysilicon layer formed beneath the silicide mask to form the anode, the cathode, and the fuse link.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is a side view illustrating various polysilicon doping levels of an electrically programmable fuse that can be implemented within embodiments of the present invention.

FIGS. 7A through 7F are top views and side views illustrating one example of a fabrication method of an electrically programmable fuse that can be implemented within embodiments of the present invention.

The detailed description explains the preferred embodiments of the invention, together with advantages and features, by way of example with reference to the drawings.

DETAILED DESCRIPTION

Figure 1A:
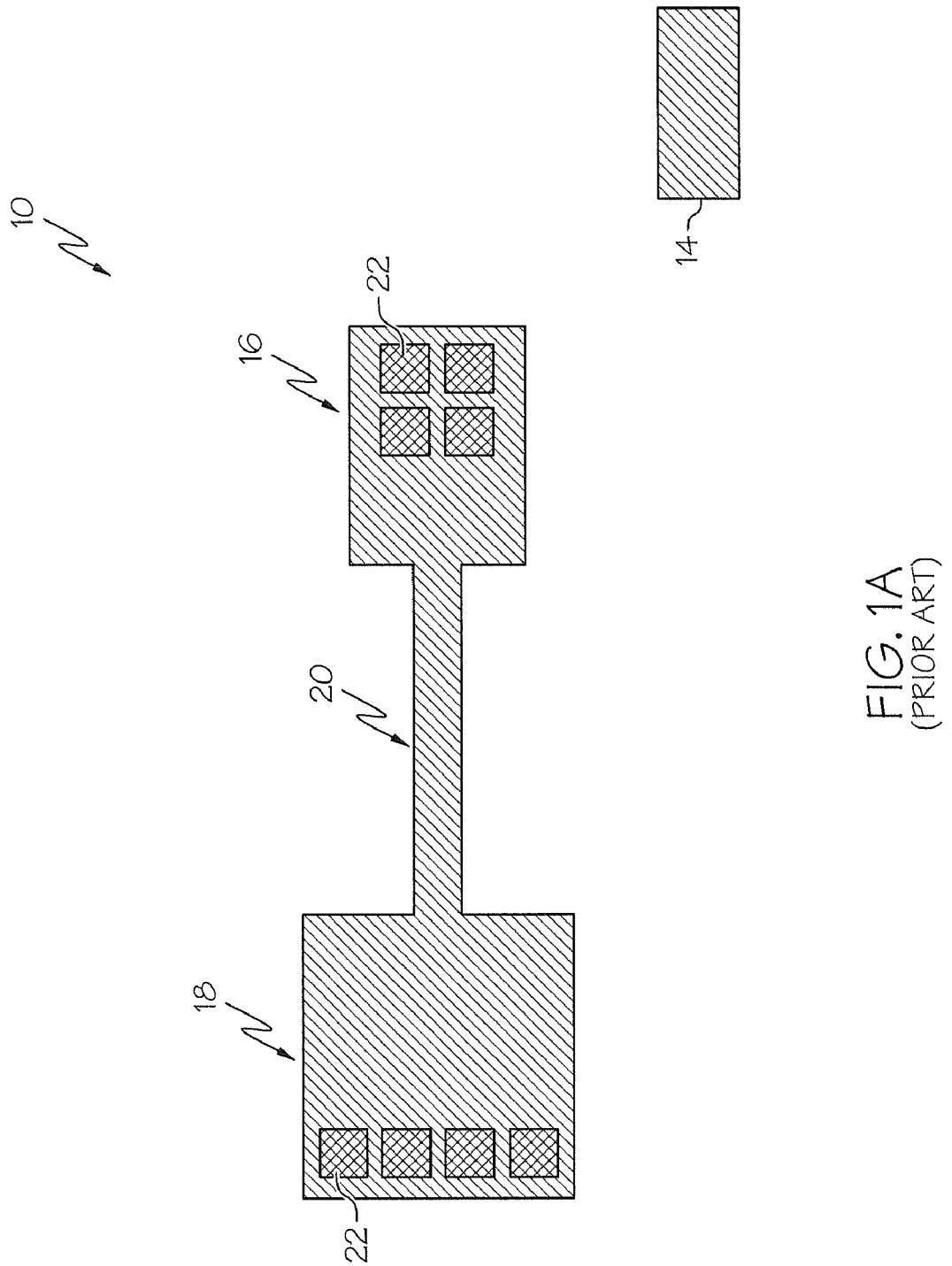
FIGS. 1A through 1C are top views illustrating one example of a conventional electrically programmable fuse before, during and after programming, respectively.
Figure 1B:
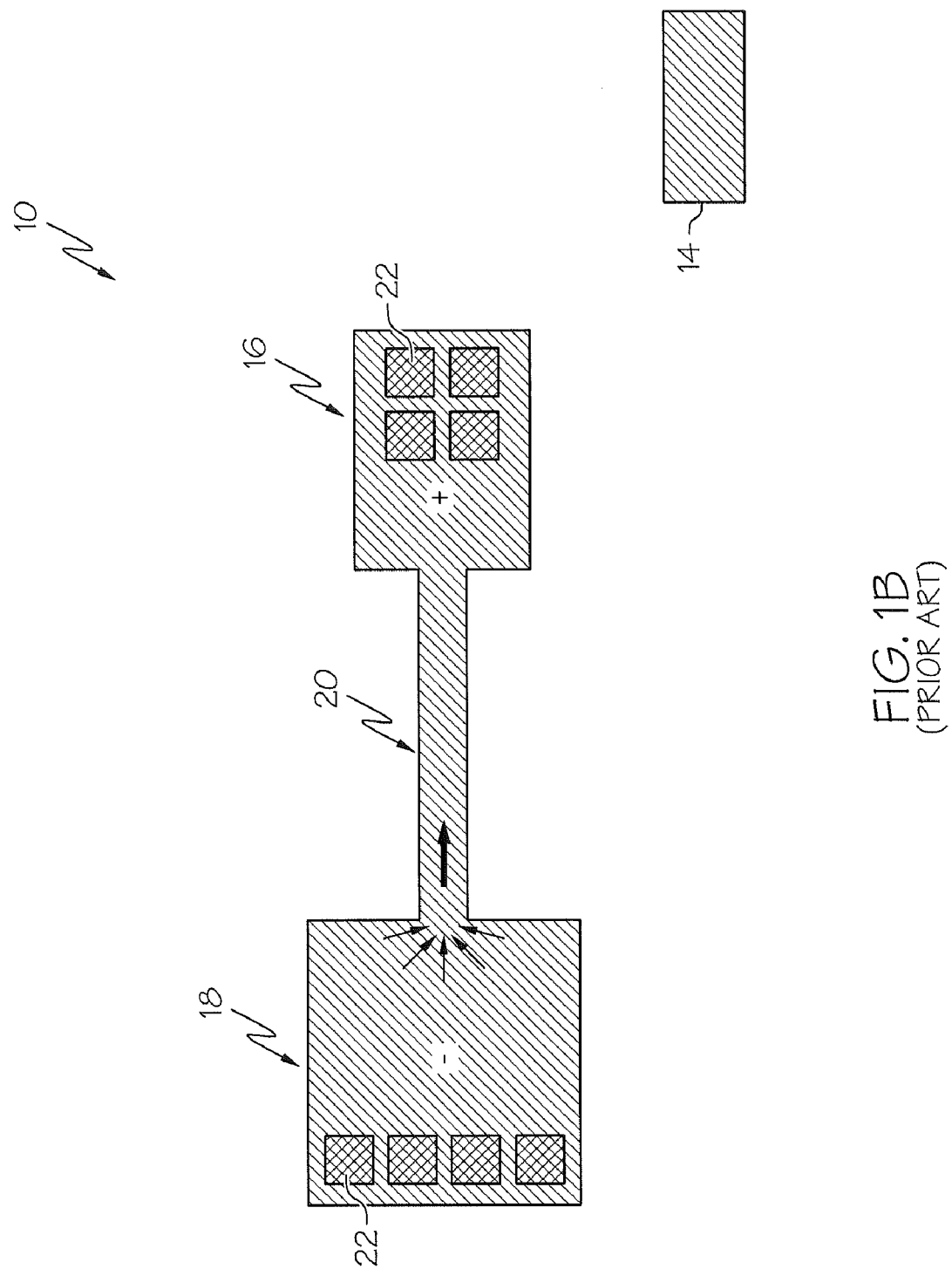
Figure 1C:
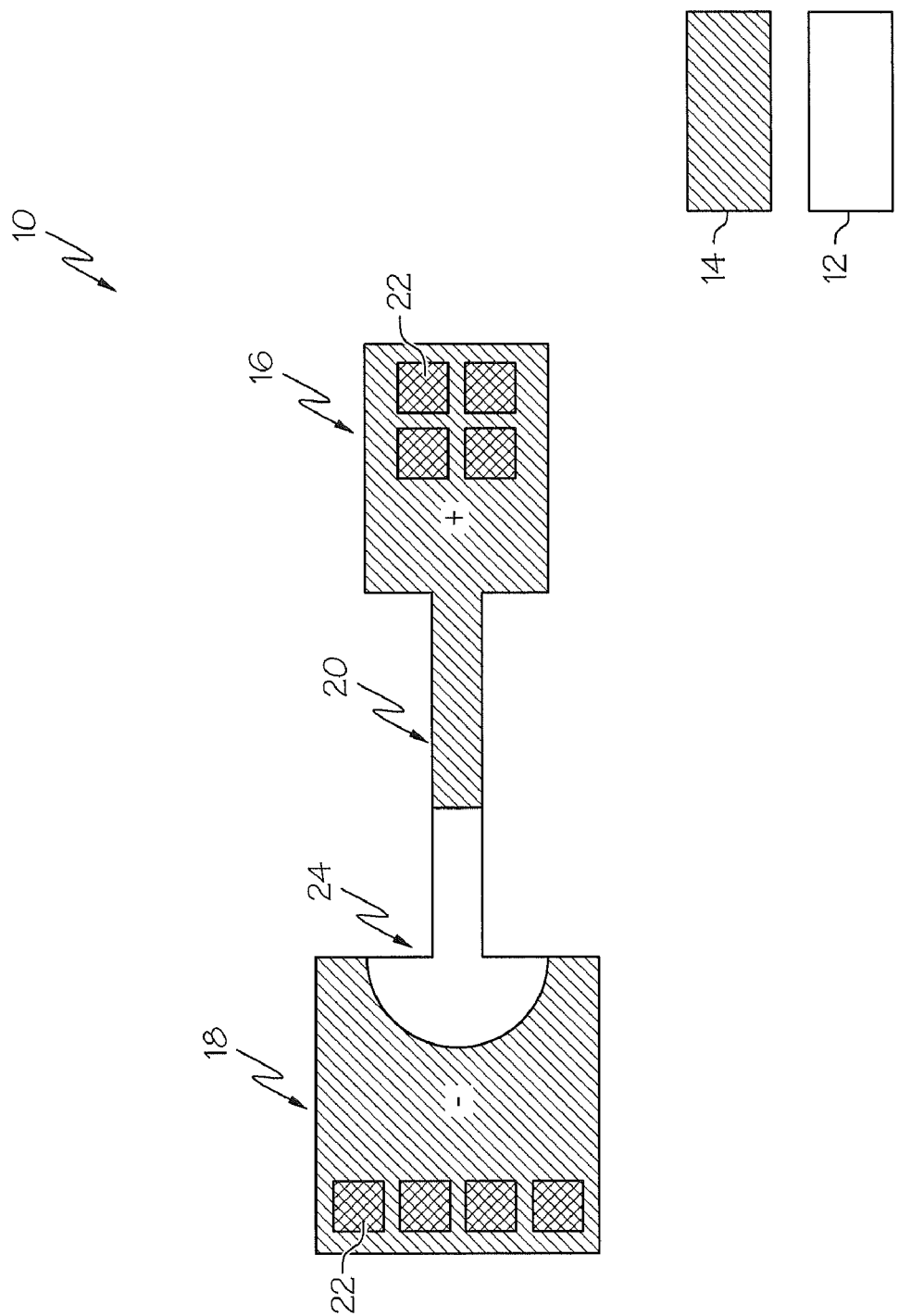
Figure 2:
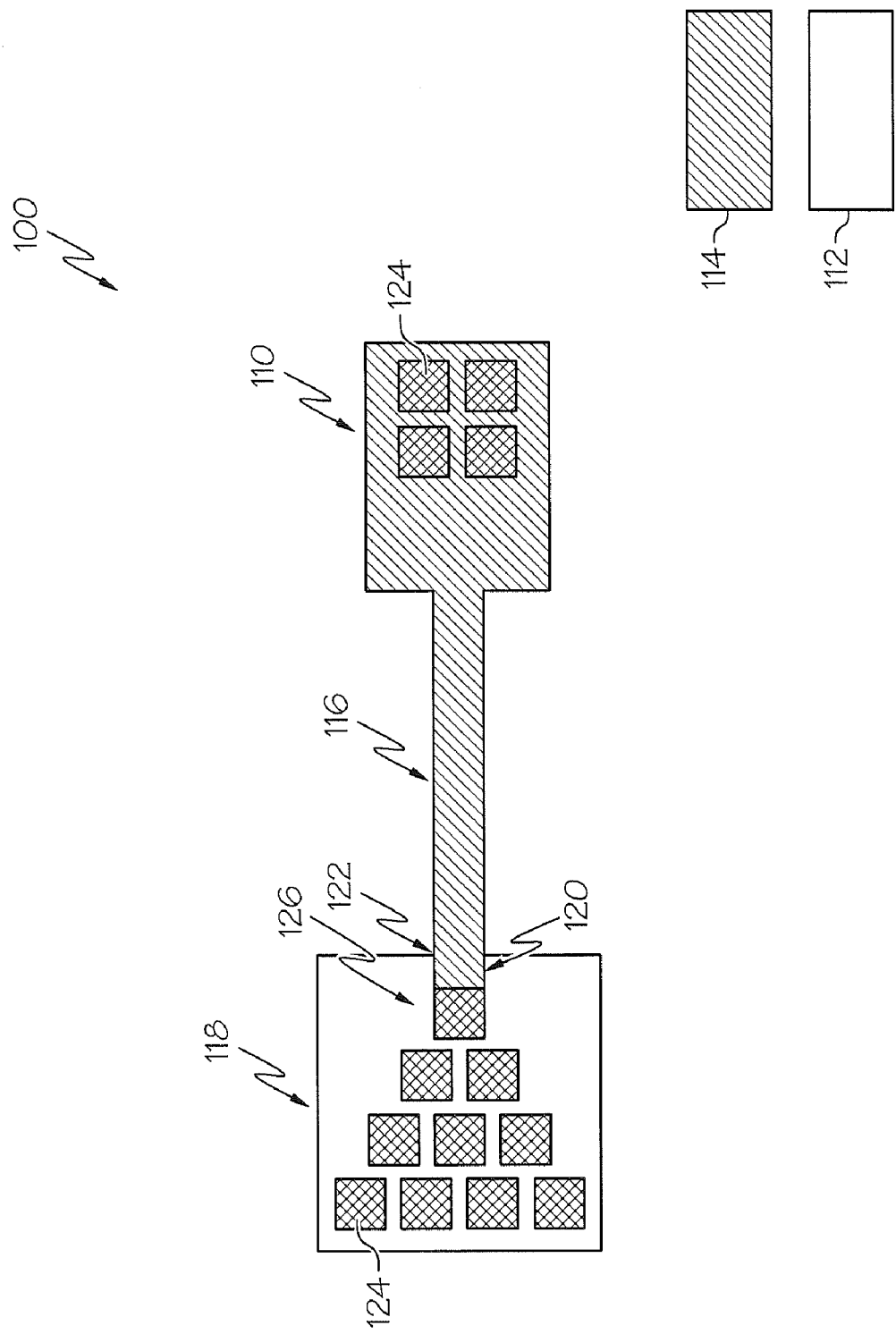
FIG. 2 is a top view illustrating one example of an electrically programmable fuse that can be implemented within embodiments of the present invention.

Turning now to the drawings in greater detail, it will be seen that in FIG. 2 there is an electrically programmable fuse 100 according to an exemplary embodiment of the present invention. The electrically programmable fuse 100 includes an anode 110, a cathode 118, and a fuse link 116 conductively connecting the cathode 118 with the anode 110. The fuse link 116 is programmable by applying a programming current. The anode 110 and the fuse link 116 each include a polysilicon layer 112 formed on a semiconductor substrate 111 (as depicted in FIGS. 5 and 7A-7F) and a silicide layer 114 formed on the polysilicon layer 112. According to an exemplary embodiment, the cathode 118 includes the polysilicon layer 112 and a partial silicide layer 120 formed on a predetermined portion of the polysilicon layer 112 of the cathode 118 located adjacent to a cathode junction 122 where the cathode 118 and the fuse link 116 meet. That is, according to the current exemplary embodiment, the silicide layer 114 is not formed on the entire polysilicon layer 112 of the cathode. Instead, a partial silicide layer 120 is formed on the cathode 118. According to an exemplary embodiment, a width of the partial silicide layer 120 of the cathode is a same width as the silicon layer 114 formed on the fuse link 116.

According to an exemplary embodiment, the electrically programmable fuse 100 further includes a plurality of contacts 124 formed on the anode 110 and the cathode 118 in a predetermined configuration. For example, as shown in FIG. 2, according to an exemplary embodiment, at least one contact 126 of the plurality of contacts 124 is formed on the partial silicide layer 120 formed on the predetermined portion of the polysilicon layer 112 of the cathode 118. As shown in FIG. 2, the partial silicide layer 120 is formed beneath the contact 126 and extends to the cathode junction 122. In the current exemplary embodiment, the contact 126 is formed along a longitudinal axis of the fuse link 116. According to another exemplary embodiment, the predetermined configuration may be arranged such that a row of contacts 124 are formed along the cathode 118 adjacent to the cathode junction 122, where all of the contacts 124 in the row of contacts 124 are formed on the partial silicide layer 120. The present invention is not limited to a particular number of contacts formed on the partial silicide layer 120, and may vary accordingly.

A programming operation of the electrically programmable fuse 100 will now be described with reference to FIGS. 3 and 4.

Figure 3:
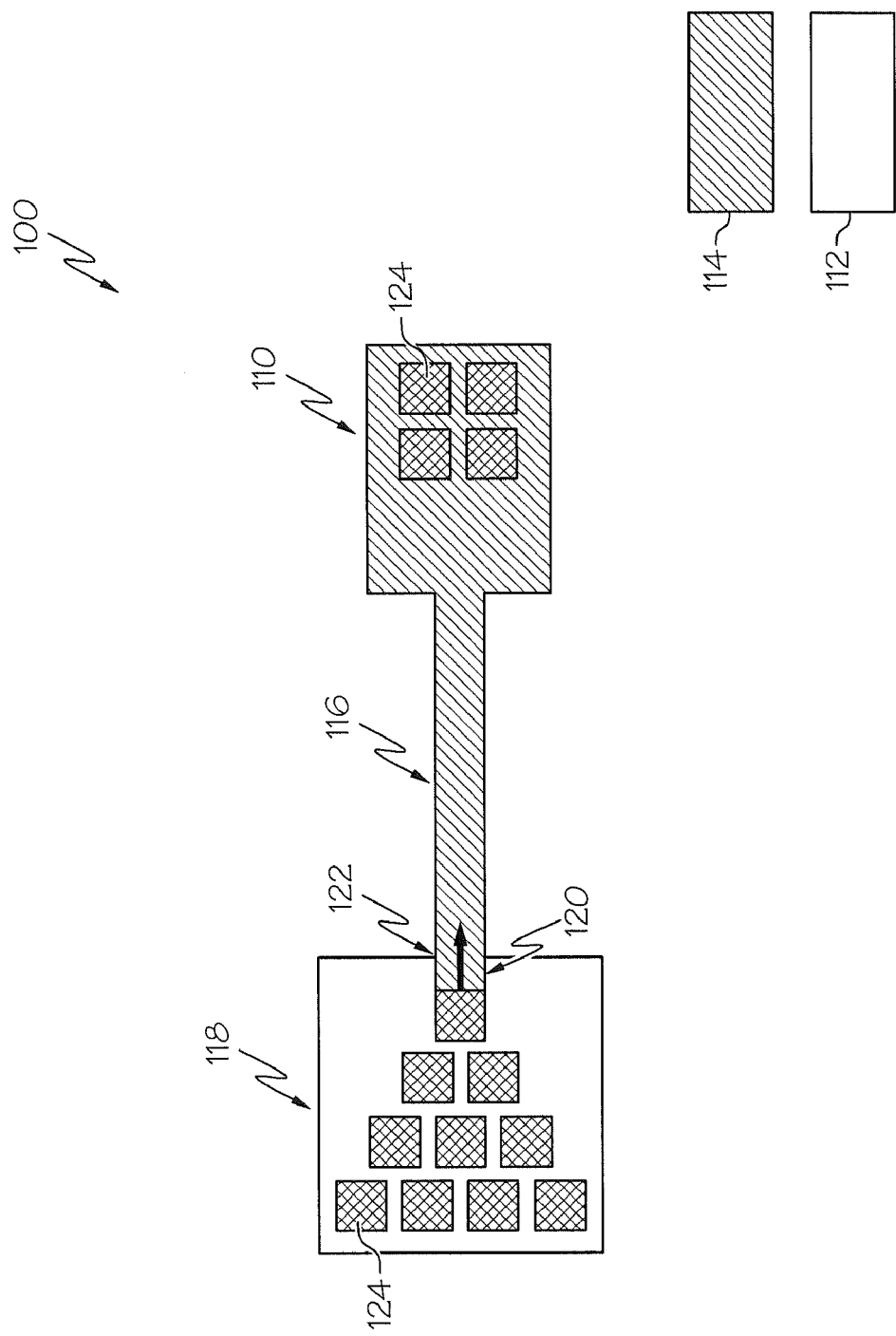
FIG. 3 is a top view illustrating one example of the electrically programmable fuse shown in FIG. 2 during programming that can be implemented within embodiments of the present invention.
Figure 4:
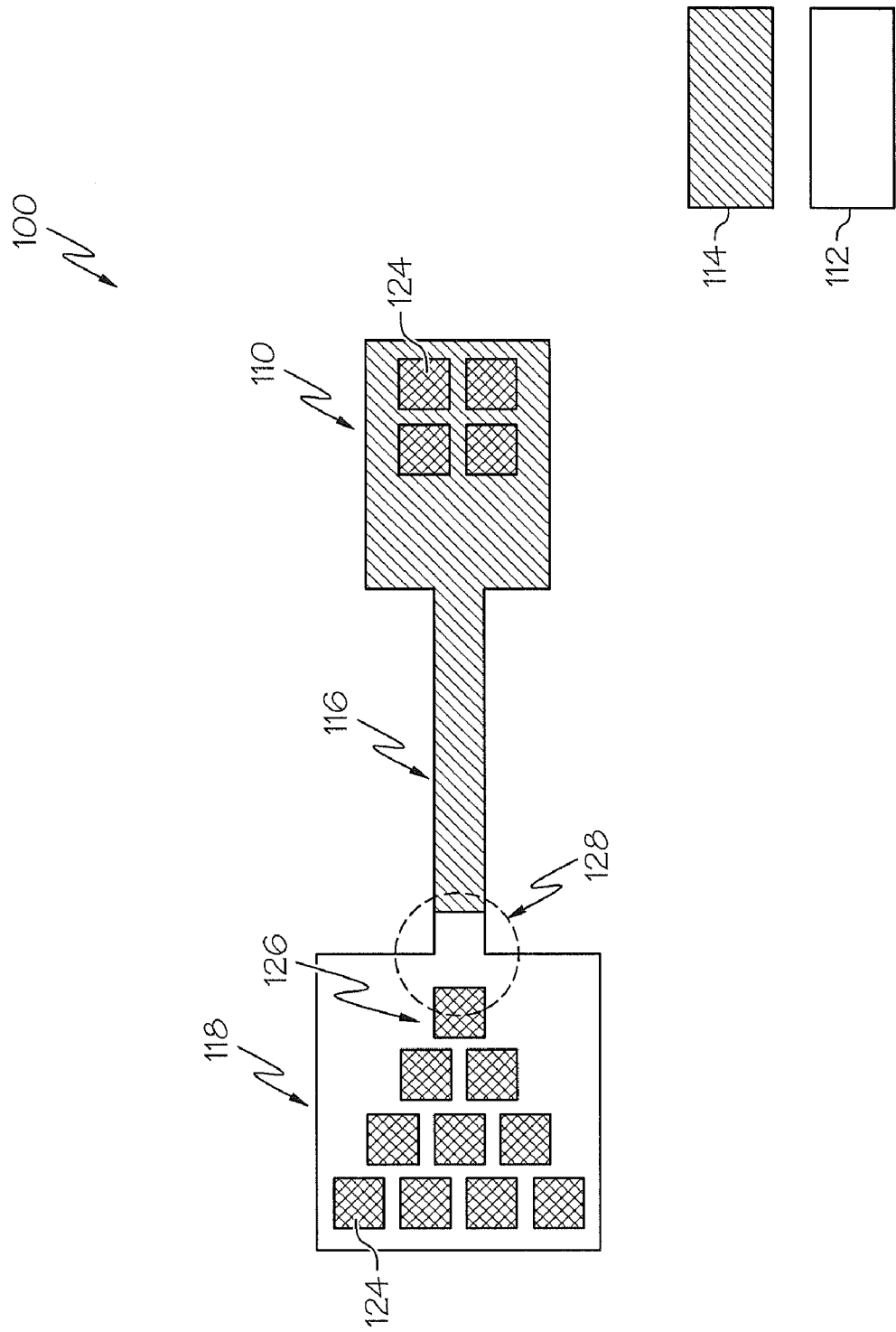
FIG. 4 is a top view illustrating an example of electromigration flux divergence of silicide after programming of the electrically programmable fuse shown in FIG. 2 that can be implemented within embodiments of the present invention.

As shown in FIG. 3, during programming, a programming current is applied through the contacts 124 to the fuse link 116. The silicide layer 114 becomes an open circuit, and the partial silicide layer 120 beneath the contact 126 and extending to the cathode junction 122 along with a portion of the silicide of the silicide layer 114 at the edge of the fuse link 116 adjacent to the cathode junction 122, is depleted. As shown in FIG. 4, a localized silicide depletion region 128 is induced, for example.

The electrically programmable fuse 100 may utilize different polysilicon doping levels. FIG. 5 illustrates various polysilicon doping levels of the electrically-programming fuse that can be implemented within embodiments of the present invention. FIG. 5 shows two different polysilicon doping levels A and B. The polysilicon doping level A is a low doping level ranging between $10^{14}$ atoms/cm$^3$ and $10^{16}$ atoms/cm$^3$, or preferably about $10^{15}$ atoms/cm$^3$, which is number of dopants per cubic centimeter volume. The polysilicon doping level A is uniform across the entire electrically programmable fuse 100 in both a non-silicide coated region (i.e., the region under the contacts 124 of the cathode 118 not including the contact 126) and the silicide coated region (i.e., the region including the partial silicide layer 120 and the silicide layer 114). On the other hand, the polysilicon doping level B is non-uniform across the entire electrically programmable fuse 100, and includes a high doping level ranging between $10^{17}$ atoms/cm$^3$ and $10^{19}$ atoms/cm$^3$, or preferably about $10^{18}$ atoms/cm$^3$, in the non-silicide coated region and a low doping level ranging between $10^{14}$ atoms/cm$^3$ and $10^{16}$ atoms/cm$^3$, or preferably about $10^{15}$ atoms/cm$^3$, in the silicide coated region. Such local high doping level results in lower resistance in the corresponding polysilicon layer, and promotes electrical current flow in the polysilicon layer near the cathode 118 within the non-silicide coated region. Therefore, more programming power can be used for improved programmability.

Figure 6A:
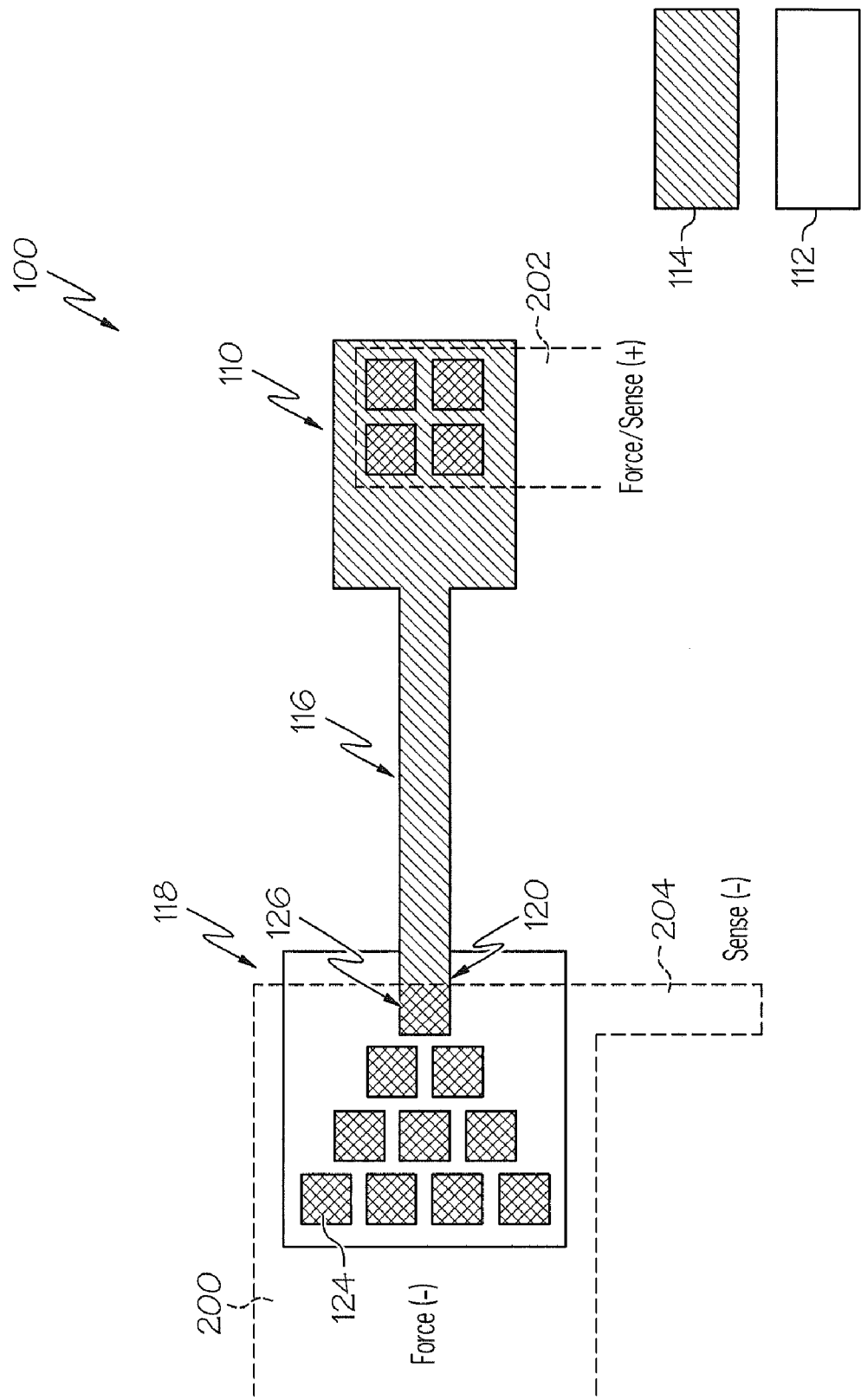
FIGS. 6A and 6B are side views illustrating examples of programming and sensing operations of an electrically programmable fuse based on the various polysilicon doping levels shown in FIG. 5 that can be implemented within embodiments of the present invention.
Figure 6B:
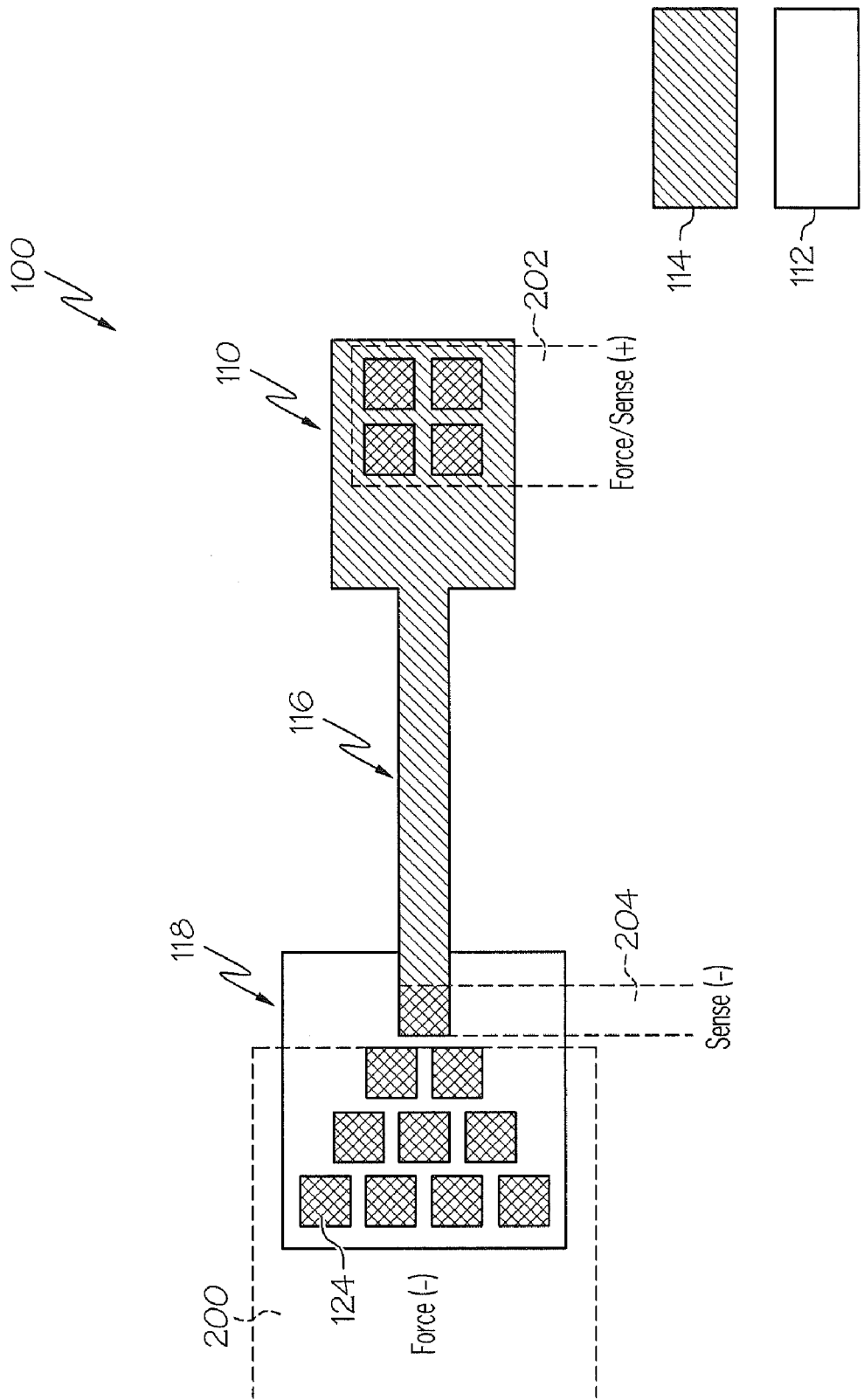

FIGS. 6A and 6B illustrate programming and sensing operations of the electrically programmable fuse according to an exemplary embodiment of the present invention. A sensing circuit may be included in an integrated circuit for sensing whether the electrically programmable fuse 100 has been programmed. Further, the sensing circuit may also determine whether resistance of the fuse 100 is high or low. As shown in FIG. 6A, a force (−) wire 200, a force (+)/sense (+) wire 202, and a sense (−) wire 204 are provided. According to an exemplary embodiment, when using the polysilicon doping level A or B, the force (−) wire 200 may provide a programming current to the plurality of contacts 124. A majority of the current may be applied to the contact 126 formed on the partial silicide layer 120. When sensing, the sense (−) wire 204 is applied only to the contact 126, and the sense (+) wire 202 is applied to the contacts 124 formed on the anode 110, to determine whether the fuse 100 has been programmed and whether the resistance of the fuse 100 is high or low. Therefore, a resistance of the electrically programmable fuse 100 is determined by sensing a first resistance at the contact 126, and senses a second resistance at the contacts 124 formed on the anode 110 and then comparing the first and second resistances to determine the resistance of the electrically programmable fuse 100.

As shown in FIG. 6B, according to an alternative exemplary embodiment, when using the polysilicon doping level B and programming the electrically programmable fuse 100, the force (−) wire 200 may apply the programming current to all of the contacts 124 except the contact 126. The current flows from all of the contacts 124 except the contact 126 into the polysilicon layer 112 and then travels up to the partial silicide layer 120 under the contact 126 and to the silicide layer 114 of the fuse link 116.

Figure 7C:
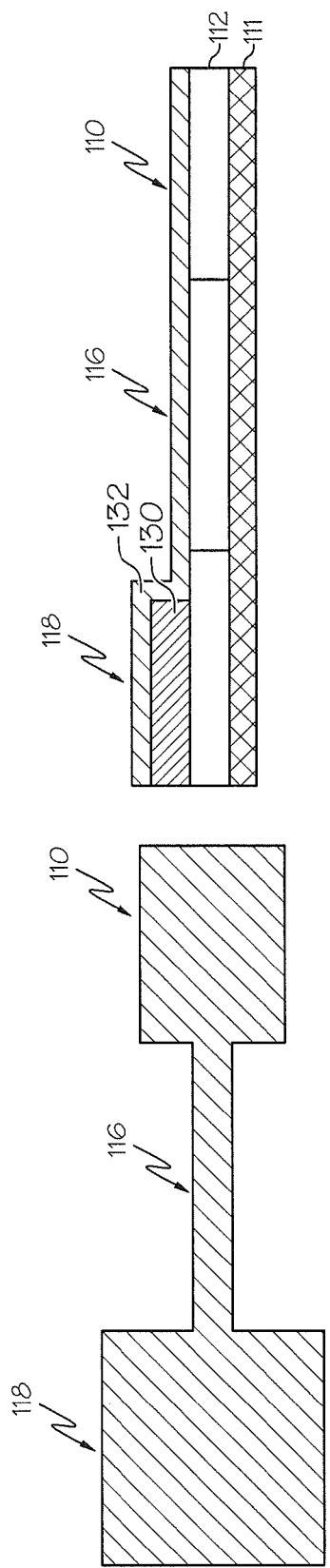

FIGS. 7A through 7F illustrate a fabrication method of an electrically-programmable fuse that can be implemented within embodiments of the present invention. As shown in FIG. 7A, a polysilicon layer 112 is formed on a semiconductor substrate 111 to form the anode 110, the fuse link 116 and the cathode 118. In FIG. 7B, a silicide mask 130 is formed on a portion of polysilicon layer 112 formed for the cathode 118, the silicide mask 130 blocks a formation of silicide on the portion. The silicon mask 130 may be formed by a photolithographic process, for example. However, the present invention is not limited hereto and any suitable process may be used.

Figure 7D:
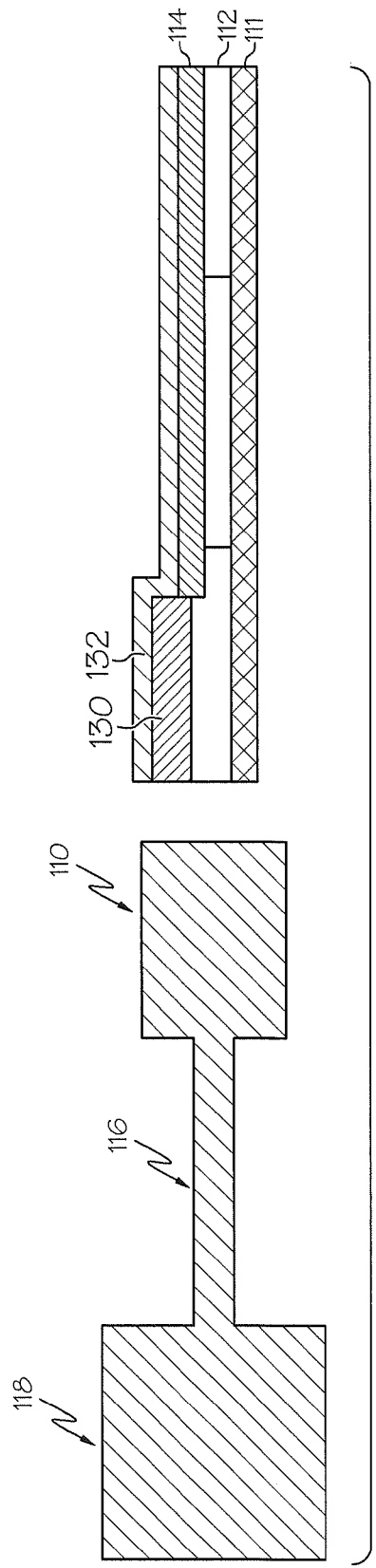
Figure 7E:
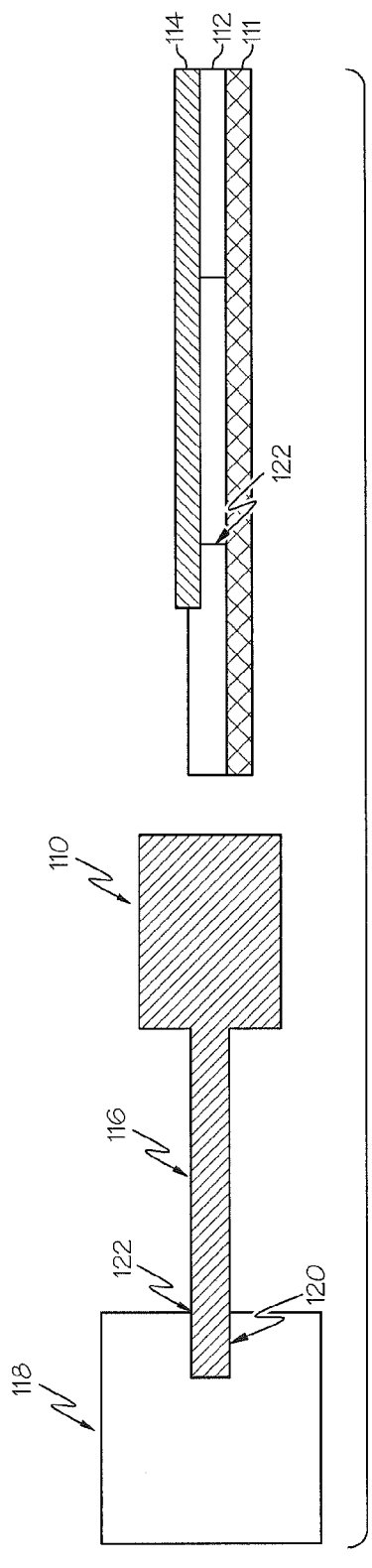
Figure 7F:
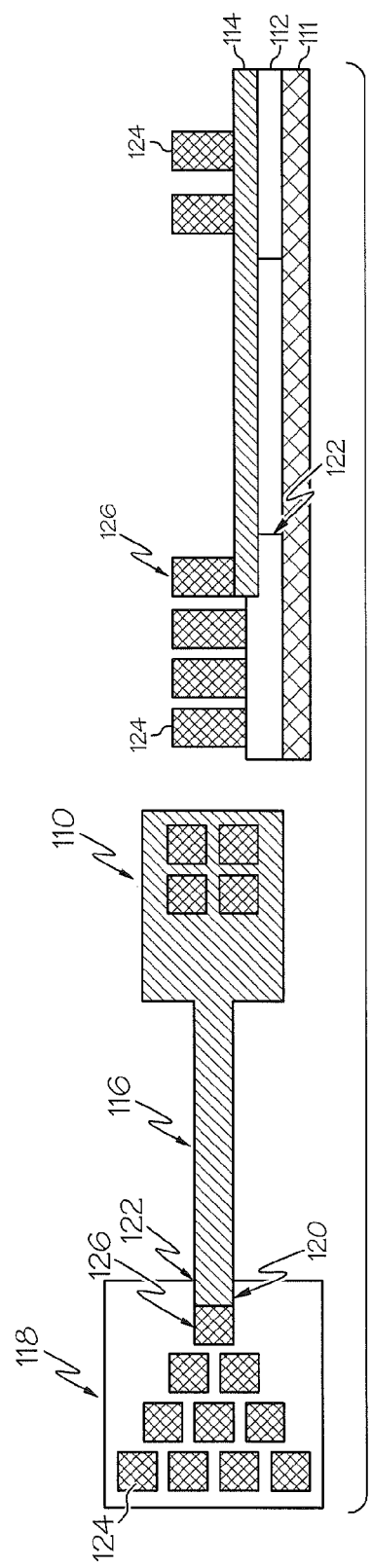

Further, as shown in FIG. 7C, a metal layer 132 is deposited on the silicide mask 130 and the remaining polysilicon layer 112 not covered by the silicide mask 130. Next, as shown in FIG. 7D, the metal layer 132 reacts with the polysilicon layer 112 and forms a silicide layer 114 by an anneal. Next, as shown in FIG. 7E, an un-reacted portion of the metal layer 132 and the silicide mask 130 are then removed from the portion of the polysilicon layer 112 formed for the cathode 118, exposing the portion of the polysilicon layer 112 formed beneath the silicide mask 130, thereby forming the anode 110, the cathode 118 ad the fuse link 116. Further, a partial silicide layer 120 is formed on the cathode 118 near a cathode junction 122 and a silicide layer 114 is formed on the polysilicon layer 112 of the anode 110 and the fuse link 116. Then, in FIG. 7F, a plurality of contacts 124 are formed on the anode 110 and the cathode 118 in a predetermined configuration. As shown in the side view of FIG. 7F, the partial silicide layer 120 is formed beneath the contact 126 and extends to the cathode junction 122. As shown in the top view of FIG. 7F, the width of the partial silicide layer 120 is the same as that of the fuse link 116, and the contact 126 is formed along the longitudinal axis of the fuse link 116.

According to an exemplary embodiment, the metal layer 132 is one of nickel, cobalt, titanium or platinum, or a combination thereof.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electrically programmable fuse comprising:
an anode;
a cathode;
a fuse link conductively connecting the cathode with the anode, which is programmable by applying a programming current,
the anode and the fuse link each comprising a polysilicon layer and a silicide layer formed on the polysilicon layer, and the cathode comprising the polysilicon layer and a partial silicide layer formed on a predetermined portion of the polysilicon layer of the cathode located adjacent to a cathode junction where the cathode and the fuse link meet, wherein a width of the partial silicide layer of the cathode is a same width as that of the fuse link; and
a plurality of contacts formed on the anode and the cathode in a predetermined configuration, wherein at least one contact of the plurality of contacts is formed on the partial silicide layer which is formed on the predetermined portion of the polysilicon layer of the cathode.

2. The electrically programmable fuse of claim 1, wherein the at least one contact of the plurality of contacts is formed along a longitudinal axis of the fuse link.

3. The electrically programmable fuse of claim 1, wherein the partial silicide layer is formed beneath the at least one contact, and extends to the cathode junction.

4. The electrically programmable fuse of claim 3, wherein the width of the partial silicide layer of the cathode corresponds to a number of contacts positioned near the cathode junction.

5. The electrically programmable fuse of claim 3, further comprising a plurality of programming wires including a first programming wire and a second programming wire, wherein when programming, the first programming wire applies the programming current through the contacts formed on the cathode and the programming current flows to the fuse link, wherein the partial silicide layer along with a portion of the silicide layer of the fuse link adjacent to the cathode junction are depleted, thereby forming a localized silicide depletion region, and the second programming wire receives and dissipates the programming current through the fuse link and the contacts formed on the anode.

6. The electrically programmable fuse of claim 3, further comprising a plurality of programming wires including a first programming wire and a second programming wire, wherein when programming, the first programming wire applies the programming current through the plurality of contacts formed on the cathode except the at least one contact, and then the programming current flows to the partial silicide layer beneath the at least one contact and to the fuse link, wherein the partial silicide layer along with a portion of the silicide layer of the fuse link adjacent to the cathode junction are depleted, thereby forming a localized silicide depletion region, and the second programming wire receives and dissipates the programming current through the fuse link and the contacts formed on the anode.

7. The electrically programmable fuse of claim 1, wherein a polysilicon doping level of a non-silicide coated region and a silicide coated region of the electrically programmable fuse is uniform, the polysilicon doping level ranges between $10^{14}$ atoms/cm$^3$ and $10^{16}$ atoms/cm$^3$.

8. The electrically programmable fuse of claim 1, wherein a polysilicon doping level of the electrically programmable fuse is non-uniform, wherein the polysilicon doping level of a non-silicide coated region of the electrically programmable fuse is higher than the polysilicon doping level of a silicide coated region of the electrically programmable fuse, the polysilicon doping level of the non-silicide coated region ranges between $10^{17}$ atoms/cm$^3$ and $10^{19}$ atoms/cm$^3$, and the polysilicon doping level of the silicide coated region of the electrically programmable fuse ranges between $10^{14}$ atoms/cm$^3$ and $10^{16}$ atoms/cm$^3$.

9. The electrically programmable fuse of claim 1, wherein the silicide layer is formed from a metal layer comprising one of nickel, cobalt, titanium or platinum, or a combination thereof.

10. The electrically programmable fuse of claim 1, further comprising a plurality of sensing wires comprising a first sensing wire and a second sensing wire to sense a resistance of the electrically programmable fuse between the at least one contact formed near the cathode junction and the contacts formed on the anode.

* * * * *